(12) United States Patent
Samad

(10) Patent No.: US 6,759,852 B1
(45) Date of Patent: Jul. 6, 2004

(54) VDD DETECTION PATH IN POWER-UP CIRCUIT

(75) Inventor: Maheen A. Samad, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 106 days.

(21) Appl. No.: 10/253,457

(22) Filed: Sep. 24, 2002

(51) Int. Cl.[7] .......................... G01R 31/08; H03L 7/00; H03K 3/02
(52) U.S. Cl. .................. 324/522; 327/143; 327/198
(58) Field of Search .................. 324/433, 765, 324/158.1; 327/546, 143, 142, 198; 320/530

(56) References Cited

U.S. PATENT DOCUMENTS

| | | | | |
|---|---|---|---|---|
| 5,969,549 A | * | 10/1999 | Kim et al. | 327/143 |
| 6,060,918 A | * | 5/2000 | Tsuchida et al. | 327/143 |
| 6,104,221 A | * | 8/2000 | Hoon | 327/143 |
| 6,236,250 B1 | * | 5/2001 | Salmon et al. | 327/143 |
| 6,407,898 B1 | * | 6/2002 | Wu | 361/86 |
| 6,586,975 B2 | * | 7/2003 | Nagaya et al. | 327/143 |
| 6,593,790 B2 | * | 7/2003 | Kim | 327/198 |

* cited by examiner

Primary Examiner—N. Le
Assistant Examiner—Donald M Lair
(74) Attorney, Agent, or Firm—E. Eric Hoffman; Edel M. Young (57) ABSTRACT

A $V_{DD}$ power-up detection circuit is provided having a p-channel transistor having a source coupled to a $V_{DD}$ voltage supply terminal and a gate coupled to a ground supply terminal. A first resistor or a diode element is coupled between the drain of the p-channel transistor and the ground supply terminal. An n-channel transistor has a source coupled to the ground supply terminal and a gate coupled to the drain of the p-channel transistor. A second resistor is coupled between a drain of the n-channel transistor and the $V_{DD}$ voltage supply terminal. A trigger circuit is coupled to the drain of the n-channel transistor. As the $V_{DD}$ supply voltage increases during power-up, the p-channel and n-channel transistors are both turned on. At this time, the trigger circuit asserts a control signal that enables an associated circuit to operate in response to the $V_{DD}$ supply voltage.

28 Claims, 4 Drawing Sheets

VDD DETECTION PATH IN POWER-UP CIRCUIT

FIELD OF THE INVENTION

The present invention relates to a power-up detection scheme in an integrated circuit. More specifically, the present invention relates to a circuit for detecting when the $V_{DD}$ (core) voltage reaches the correct level for operating an associated circuit.

BACKGROUND OF THE INVENTION

Figure 1:
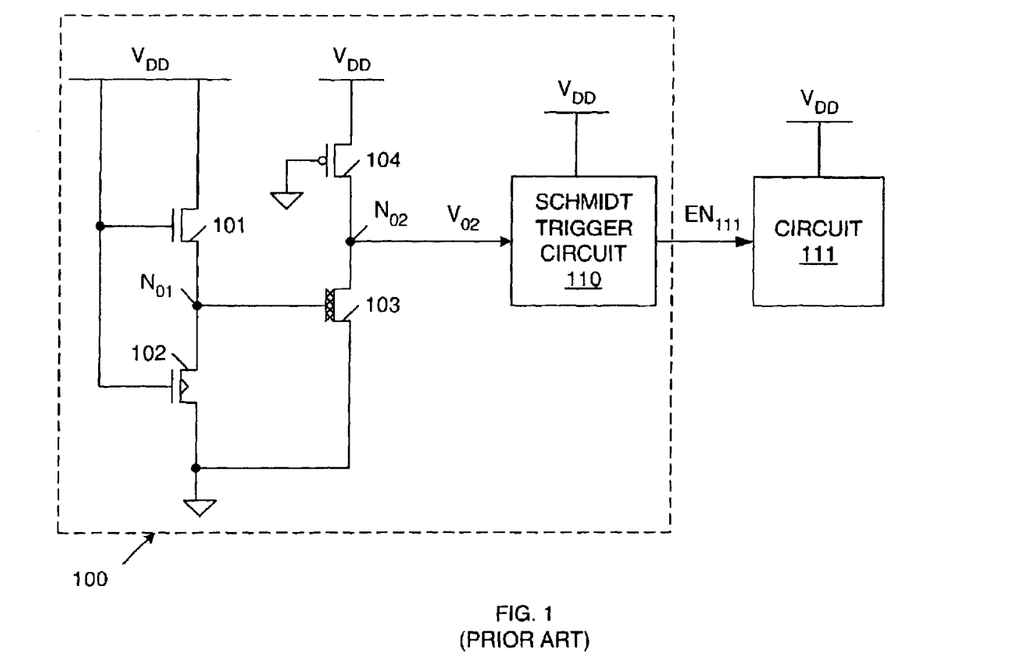
FIG. 1 is a circuit diagram of a conventional $V_{DD}$ power-up detection circuit and an associated circuit, which is powered from the $V_{DD}$ supply voltage.

FIG. 1 is a circuit diagram of a conventional $V_{DD}$ power-up detection circuit 100 and an associated circuit 111, which is powered by a $V_{DD}$ supply voltage. $V_{DD}$ power-up detection circuit 100 includes n-channel MOS transistors 101–103, p-channel MOS transistor 104 and Schmidt trigger circuit 110. N-channel transistor 101 is a conventional thin oxide transistor of the type typically used in circuit 111. N-channel transistor 103 is a thick oxide transistor, which has a gate oxide that is thicker than that of n-channel transistor 101. N-channel transistor 101 has a threshold voltage of about 370 milli-Volts (mV). Thick oxide transistor 103 has a threshold voltage of about 430 mV. N-channel transistor 102 is a low-threshold voltage transistor (as indicated by the triangle in the channel region of this transistor), which has a threshold voltage of about 240 mV. An additional implant mask is required to form low-threshold voltage transistor 102.

N-channel transistors 101 and 102 are connected in series between the $V_{DD}$ voltage supply terminal and the ground voltage supply terminal. More specifically, n-channel transistor 101 is coupled between the $V_{DD}$ voltage supply terminal and node $N_{01}$, and n-channel transistor 102 is coupled between node $N_{01}$ and the ground voltage supply terminal. The gates of n-channel transistors 101 and 102 are commonly connected to the $V_{DD}$ voltage supply terminal.

P-channel transistor 104 and n-channel transistor 103 are connected in series between the $V_{DD}$ voltage supply terminal and the ground supply terminal. More specifically, p-channel transistor 104 is coupled between the $V_{DD}$ voltage supply terminal and node $N_{02}$, and n-channel transistor 103 is coupled between node $N_{02}$ and the ground voltage supply terminal. The gate of p-channel transistor 104 is coupled to the ground voltage supply terminal, and the gate of n-channel transistor 103 is coupled to node $N_{01}$. Node $N_{02}$ is coupled to provide a voltage $V_{02}$ to Schmidt trigger circuit 110.

During power-up, the voltage on the $V_{DD}$ voltage supply terminal increases from a value of 0 Volts to the nominal $V_{DD}$ supply voltage. N-channel transistors 101–103 and p-channel transistor 104 are initially turned off when the $V_{DD}$ supply voltage is equal to 0 Volts. When the $V_{DD}$ supply voltage starts to increase, p-channel transistor 104, which has a gate coupled to ground, ideally turns on first with the desired behavior of subthreshold conduction. Thus, the output voltage $V_{02}$ on node $N_{02}$ initially tracks the increasing $V_{DD}$ supply voltage.

As the $V_{DD}$ supply voltage increases, the low-threshold voltage n-channel transistor 102 will turn on faster than n-channel transistor 101. As a result, the low-threshold voltage n-channel transistor 102 initially pulls down the voltage on node $N_{01}$, thereby ensuring that n-channel transistor 103 remains off, and the output voltage $V_{02}$ on node $N_{02}$ continues to track the $V_{DD}$ supply voltage. In order for this to occur, the subthreshold conduction of transistor 101 must be less than the threshold conduction of transistor 102.

As the $V_{DD}$ supply voltage continues to increase, n-channel transistor 101 turns on stronger, thereby causing the voltage on node $N_{01}$ to be pulled up. Eventually, the voltage on node $N_{01}$ becomes high enough to turn on n-channel transistor 103. At this time, the voltage $V_{02}$ on node $N_{02}$ begins to be pulled down toward ground. Schmidt trigger circuit 110 detects when this voltage $V_{02}$ drops below the $V_{DD}$ supply voltage by a predetermined percentage. Upon detecting this voltage drop, trigger circuit 110 asserts a logic high enable signal $EN_{111}$, which is used to activate circuit 111. It is intended that circuit 111 is only enabled after the $V_{DD}$ supply voltage has reached an acceptable level for operating this circuit 111.

However, in order for circuit 100 to operate as described above, the following conditions must be met by transistors 101–104. First, the subthreshold conductance of low threshold voltage transistor 102 must be greater than the subthreshold conductance of transistor 101, in order to ensure that node $N_{01}$ is not pulled up to the $V_{DD}$ supply voltage when the $V_{DD}$ supply voltage is less than the threshold voltage of low threshold voltage transistor 102 (240 mV). Second, the subthreshold conductance of transistor 101 must be less than the on-conductance of low threshold voltage transistor 102, thereby ensuring that node $N_{01}$ is pulled down when the $V_{DD}$ supply voltage is greater than the threshold voltage of transistor 102 (240 mV), but less than the threshold voltage of transistor 101 (370 mV). Third, as the $V_{DD}$ supply voltage increases, the on-conductance of transistor 101 must become greater than the on-conductance of low threshold transistor 102, thereby ensuring that node $N_{01}$ is eventually pulled up toward the $V_{DD}$ supply voltage. Fourth, the on-conductance of p-channel transistor 104 must be greater than the subthreshold conductance of n-channel transistor 103, thereby ensuring that the voltage $V_{02}$ tracks the $V_{DD}$ supply voltage while the voltage on node $N_{01}$ is less than the threshold voltage of n-channel transistor 103 (430 mV). Finally, as the $V_{DD}$ supply voltage increases, the on-conductance of n-channel transistor 103 must become greater than the on-conductance of p-channel transistor 104, thereby ensuring that node N02 is eventually pulled down toward the ground supply voltage.

If the above-listed relationships are not true, circuit 100 may operate improperly. For example, if the subthreshold conductance of transistor 101 is greater than the on-conductance of low-threshold voltage transistor 102, then the voltage on node $N_{01}$ may be pulled up toward the $V_{DD}$ supply voltage, thereby causing the voltage on node $N_{02}$ to be pulled low relative to the $V_{DD}$ supply voltage. In this case, Schmidt trigger circuit 110 may erroneously activate the enable signal $EN_{111}$, before the $V_{DD}$ supply voltage has reached an acceptably high voltage. The same result may occur if the subthreshold conductance of transistor 101 is greater than the subthreshold conductance of transistor 102, or if the subthreshold conductance of transistor 103 is greater than the on-conductance of p-channel transistor 104.

Conversely, if the on-conductance of transistor 102 is greater than the on-conductance of transistor 101, then the voltage on node $N_{01}$ may be pulled down toward the ground supply terminal, such that transistor 103 fails to turn on. In this case, the voltage $V_{02}$ will continue to be pulled up to the $V_{DD}$ supply voltage, and Schmidt trigger circuit 101 will not activate the enable signal $EN_{111}$, even after the $V_{DD}$ supply voltage has reached an acceptable operating level. The same result may occur if the on-conductance of transistor 104 is greater than the on-conductance of transistor 103.

As $V_{DD}$ supply voltages become smaller, approaching levels of 1.2 Volts and lower, the sub-threshold currents become larger, such that the above listed requirements cannot be reliably met. Moreover as the $V_{DD}$ supply voltage decreases, it becomes difficult to significantly increase the on-conductance of transistor 101 relative to the on-conductance of transistor 102 (i.e., the width of transistor 101 must become unrealistically large). In reality, it is difficult, if not impossible, to design transistors 101 and 102 such that transistor 101 is able to reliably overpower transistor 102 before the $V_{DD}$ supply voltage exceeds 700 mV.

It would therefore be desirable to have a circuit that is capable of reliably detecting when a $V_{DD}$ supply voltage having a relatively low nominal voltage (e.g., 1.2 Volts or less) reaches an acceptable level during power-up. It would also be desirable if such a circuit does not require low threshold voltage transistors, thereby eliminating an additional implant mask.

SUMMARY

Accordingly, the present invention provides a $V_{DD}$ power-up detection circuit that includes a p-channel transistor having a source coupled to a $V_{DD}$ voltage supply terminal, a drain coupled to a first node, and a gate coupled to a ground supply terminal. A first resistor (or a diode element) is coupled between the first node and the ground supply terminal. An n-channel transistor has a source coupled to the ground supply terminal, a drain coupled to a second node, and a gate coupled to the first node. A second resistor is coupled between the second node and the $V_{DD}$ voltage supply terminal. A trigger circuit is coupled to receive a control voltage from the second node.

Initially, the p-channel transistor is turned off because the $V_{DD}$ supply voltage is less than the threshold voltage of the p-channel transistor. The p-channel transistor is designed such that the subthreshold conductance of the p-channel transistor is less than the conductance of the first resistor. As a result, the control voltage on the first node is initially pulled down to the ground supply voltage through the first resistor.

At this time, the low voltage on the first node turns off the n-channel transistor. The n-channel transistor is designed such that the subthreshold conductance of the n-channel transistor is less than the conductance of the second resistor. As a result, the control voltage on the second node is initially pulled up to the $V_{DD}$ supply voltage through the second resistor.

The first and second resistors ensure well-behaved and predictable signal characteristics when the $V_{DD}$ supply voltage is less than the threshold voltages of the p-channel transistor and the n-channel transistor. Advantageously, there is no need to depend on the relative subthreshold conductances of different transistors. As a result, the $V_{DD}$ power-up detection circuit of the present invention will not prematurely indicate that the $V_{DD}$ supply voltage has reached an acceptable level. This predictability is desirable in a critical circuit such as a $V_{DD}$ power-up detect circuit.

As the $V_{DD}$ supply voltage increases during power-up, the p-channel transistor begins to turn on, thereby pulling up the voltage on the first node. The p-channel transistor is designed such that the on-conductance of the p-channel transistor becomes greater than the conductance of the first resistor, when the $V_{DD}$ supply voltage reaches a predetermined voltage greater than the threshold voltage of the p-channel transistor, but less than the full $V_{DD}$ supply voltage.

As the voltage on the first node increases, the n-channel transistor begins to turn on, thereby pulling down the control voltage on the second node. The n-channel transistor is designed such that the on-conductance of the n-channel transistor becomes greater than the conductance of the second resistor when the voltage on the first node reaches a predetermined voltage greater than the threshold voltage of the n-channel transistor, but less than the full $V_{DD}$ supply voltage.

When the control voltage on the second node is pulled down below a predetermined percentage of the $V_{DD}$ supply voltage, the trigger circuit activates an enable signal, which is used to enable an associated circuit to operate from the $V_{DD}$ supply voltage.

Advantageously, the trigger circuit does not activate the enable signal until after the $V_{DD}$ supply voltage has exceeded at least the threshold voltages of both the p-channel transistor and the n-channel transistor. This ensures that the $V_{DD}$ supply voltage has reached an appropriate level before the associated circuit, which likely includes both n-channel and p-channel transistors, is enabled to operate from the $V_{DD}$ supply voltage.

The $V_{DD}$ power-up detect circuit of the present invention advantageously requires fewer active circuit elements than conventional $V_{DD}$ power-up detection circuit 100, thereby providing for a smaller layout area. The $V_{DD}$ power-up detection circuit of the present invention also advantageously requires fewer types of circuit elements than conventional $V_{DD}$ power up detection circuit 100, thereby reducing the circuit variables. Moreover, because the $V_{DD}$ power-up detection circuit of the present invention does not require low threshold voltage transistors, an additional implant mask is not required.

The present invention will be more fully understood in view of the following description and drawings.

DETAILED DESCRIPTION

Figure 2:
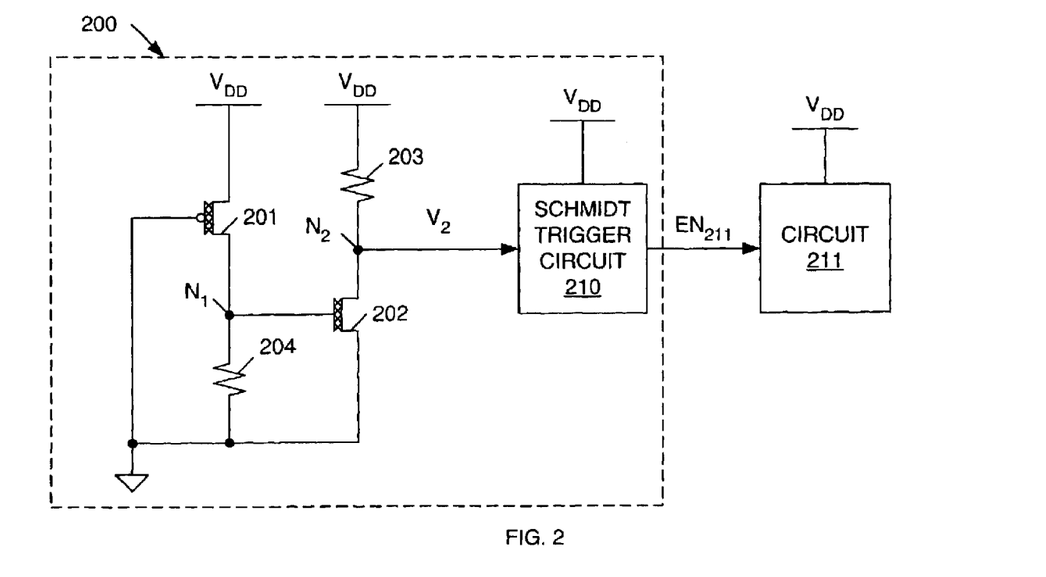
FIG. 2 is a circuit diagram of a $V_{DD}$ power-up detection circuit and an associated circuit, which is powered from the $V_{DD}$ supply voltage, in accordance with one embodiment of the present invention.

FIG. 2 is a circuit diagram of a $V_{DD}$ power-up detection circuit 200 and an associated circuit 211 in accordance with one embodiment of the present invention. $V_{DD}$ power-up detection circuit 200 includes p-channel MOS transistor 201, n-channel MOS transistor 202, resistors 203–204, and Schmidt trigger circuit 210. In general, $V_{DD}$ power-up detection circuit 200 determines when the $V_{DD}$ supply voltage has reached a level capable of operating the transistors in the associated circuit 211. P-channel transistor 201 and resistor 204 are connected in series between the $V_{DD}$ voltage supply terminal and the ground voltage supply terminal. More specifically, p-channel transistor 201 is coupled between the $V_{DD}$ voltage supply terminal and node $N_1$, and resistor 204 is coupled between node $N_1$ and the ground voltage supply terminal. The gate of p-channel transistor 201 is coupled to the ground voltage supply terminal.

Resistor 203 and n-channel transistor 202 are also connected in series between the $V_{DD}$ voltage supply terminal and the ground voltage supply terminal. More specifically, resistor 203 is coupled between the $V_{DD}$ voltage supply terminal and node $N_2$, and n-channel transistor 202 is coupled between node $N_2$ and the ground voltage supply terminal. The gate of n-channel transistor 202 is coupled to node $N_1$. Node $N_2$ is coupled to provide a voltage $V_2$ to Schmidt trigger circuit 210.

In the described embodiment, the channel region of p-channel transistor 201 has a width of about 30.6 microns and a length of about 0.3 microns. P-channel transistor 201 exhibits a threshold voltage of about 410 mV. The channel region of n-channel transistor 202 has a width of about 30 microns and a length of about 0.3 microns. N-channel transistor 202 exhibits a threshold voltage of about 430 mV. In the described embodiment, each of resistors 203 is an unsalicided, p+ type polysilicon resistor having a resistance of about 26.9 kOhms. This type of resistor exhibits a relatively small layout area, and can be fabricated in a consistent manner with only small variations in resistance. This type of resistor is also advantageously able to be slightly modified after silicon processing is complete. Other types of resistors can be used in other embodiments.

During power-up, the voltage on the $V_{DD}$ voltage supply terminal increases from a value of 0 Volts to the nominal $V_{DD}$ supply voltage. In the described embodiment, the nominal $V_{DD}$ supply voltage is about 1.2 Volts. As described in more detail below, circuit 200 is designed to operate properly as long as the $V_{DD}$ supply voltage has a value of at least about 0.8 Volts. By modifying the characteristics of the various elements, circuit 200 can be designed to operate in response to other nominal $V_{DD}$ supply voltages in other embodiments, especially other low $V_{DD}$ voltage supply embodiments.

Initially, the $V_{DD}$ supply voltage applied to the source of p-channel transistor 201 has a voltage of about 0 Volts, thereby turning off p-channel transistor 201. The subthreshold conductance of p-channel transistor 201 is significantly less than the conductance of resistor 204. As a result, node $N_1$ is pulled down to a voltage of about 0 Volts through resistor 204. The low voltage on node $N_1$ causes transistor 202 to turn off. The subthreshold conductance of n-channel transistor 202 is significantly less than the conductance of resistor 203. As a result, node $N_2$ is pulled up to a voltage equal to the $V_{DD}$ supply voltage through resistor 203.

Because resistors 203 and 204 are inactive fixed circuit elements, it is relatively easy to design these resistors 203–204 to exhibit conductances greater than the subthreshold conductances of the associated transistors 202 and 201.

As the $V_{DD}$ supply voltage increases, p-channel transistor 201 begins to turn on. As p-channel transistor 201 turns on, the voltage on node $N_1$ increases. As the voltage on node $N_1$ increases, n-channel transistor 202 begins to turn on. As n-channel transistor 202 turns on, the voltage $V_2$ on node $N_2$ decreases.

When the $V_{DD}$ supply voltage reaches or exceeds the threshold voltage of p-channel transistor 201, this transistor 201 begins to turn on, thereby causing the conductance of p-channel transistor 201 to increase. As a result, the voltage on node $N_1$ is pulled up toward the $V_{DD}$ supply voltage. P-channel transistor 201 is designed such that the on-conductance of this transistor 201 becomes significantly greater than the conductance of resistor 204 when the $V_{DD}$ supply voltage reaches a predetermined voltage greater than the threshold voltage of p-channel transistor 201 but less than the full $V_{DD}$ supply voltage. The on-conductance of a transistor is defined as the conductance of the transistor when the gate-to-source voltage of the transistor is greater than the threshold voltage of the transistor. Note that the on-conductance of a transistor increases as the gate-to-source voltage of the transistor increases above the threshold voltage of the transistor.

When the on-conductance of p-channel transistor 201 becomes significantly greater than the conductance of resistor 204, the voltage on node $N_1$ will be pulled up to a value close to the $V_{DD}$ supply voltage.

When the voltage on node $N_1$ reaches or exceeds the threshold voltage of n-channel transistor 202, this transistor 202 begins to turn on, thereby causing the conductance of n-channel transistor 202 to increase. As a result, the voltage on node $N_2$ is pulled down toward the ground supply voltage. N-channel transistor 202 is designed such that the on-conductance of this transistor 202 becomes significantly greater than the conductance of resistor 203 when the voltage on node $N_1$ reaches a predetermined voltage greater than the threshold voltage of n-channel transistor 202 but less than the full $V_{DD}$ supply voltage.

When the on-conductance of n-channel transistor 202 becomes significantly greater than the conductance of resistor 203, the voltage on node $N_2$ will be pulled down to a value close to the ground supply voltage.

Again, because resistors 203 and 204 are inactive fixed circuit elements it is relatively easy to design these resistors 203–204 to exhibit conductances less than the on-conductances of the associated transistors 202 and 201.

Schmidt trigger circuit 210 detects when the voltage $V_2$ on node $N_2$ is pulled down a predetermined percentage below the $V_{DD}$ supply voltage, and in response, activates the enable signal $EN_{211}$. In one embodiment, Schmidt trigger circuit 210 activates the enable signal $EN_{211}$ when the voltage $V_2$ is about 25% of the $V_{DD}$ supply voltage. The activated enable signal $EN_{211}$ indicates that the $V_{DD}$ supply voltage has reached a voltage adequate to supply circuit 211. Thus, circuit 211 is enabled in response to the activated enable signal $EN_{211}$. In the present embodiment, it is estimated that the enable signal $EN_{211}$ will be activated when the $V_{DD}$ supply voltage reaches about 523 mV, and the voltage $V_2$ is pulled down to a voltage of about 129 mV.

Advantageously, Schmidt trigger circuit 210 does not activate the enable signal $EN_{211}$ until after the $V_{DD}$ supply voltage has exceeded the threshold voltages of both p-channel transistor 201 and n-channel transistor 202. This ensures that the $V_{DD}$ supply voltage has reached an appropriate level before the associated circuit 211 is enabled to operate from the $V_{DD}$ supply voltage. That is, circuit 200 ensures that the $V_{DD}$ supply voltage has reached a level that is capable of operating both p-channel and n-channel transistors before enabling the associated circuit 211.

Moreover, $V_{DD}$ power-up detection circuit 200 takes advantage of resistors 203–204, which are inactive devices that are always on. As described above, the operation of these resistors 203–204 is relatively predictable (compared with low-voltage threshold transistor 102 and p-channel transistor 104 of the prior art $V_{DD}$ power-up detection circuit 100 of FIG. 1). This predictability is desirable in a critical circuit such as a $V_{DD}$ power-up detection circuit.

Advantageously, resistors 203 and 204 eliminate the need to depend on the relative subthreshold conductances of different transistors. Resistors 203 and 204 ensure that the voltage $V_2$ will track the $V_{DD}$ supply voltage until the $V_{DD}$ supply voltage reaches a voltage close to a predetermined voltage which is greater than the threshold voltages of transistors 201 and 202. As a result, the $V_{DD}$ power-up detection circuit of the present invention will not prematurely indicate that the $V_{DD}$ supply voltage has reached an acceptable level.

In accordance with one embodiment, transistors 201 and 202 can be thick oxide transistors (as illustrated by the X's near the gate symbols of these transistors in FIG. 2). Thick oxide transistors have a relatively thick gate oxide, and are designed to operate in response to a supply voltage greater than the $V_{DD}$ supply voltage. Thick oxide transistors are typically used in input/output circuitry of an integrated circuit. In contrast, core transistors, which have a relatively thin gate oxide, are designed to operate in response to the $V_{DD}$ supply voltage. For example, a core transistor designed to operate in response to a $V_{DD}$ supply voltage of 1.2 Volts might have a gate oxide thickness of about 1.3 nanometers (nm), while a thick oxide transistor on the same integrated circuit might be designed to operate in response to a supply voltage of 2.5 Volts and have a gate oxide thickness of about 5.1 nm. A thick oxide transistor has a higher threshold voltage than a thin oxide transistor. Thus, when transistors 201 and 202 are implemented using thick oxide transistors, the Schmidt trigger circuit 210 is not triggered until the $V_{DD}$ supply voltage exceeds the relatively high threshold voltages of the thick oxide transistors. As a result, the thick oxide transistors provide additional margin to $V_{DD}$ power-up detection circuit 200. That is, if the $V_{DD}$ supply voltage is high enough to turn on both of thick oxide transistors 201–202, then the $V_{DD}$ supply voltage is necessarily high enough to turn on thin oxide transistors of the associated circuit 211.

If the above-described operating margin is not required or desired, then transistors 201–202 can be implemented using core transistors.

Figure 3:
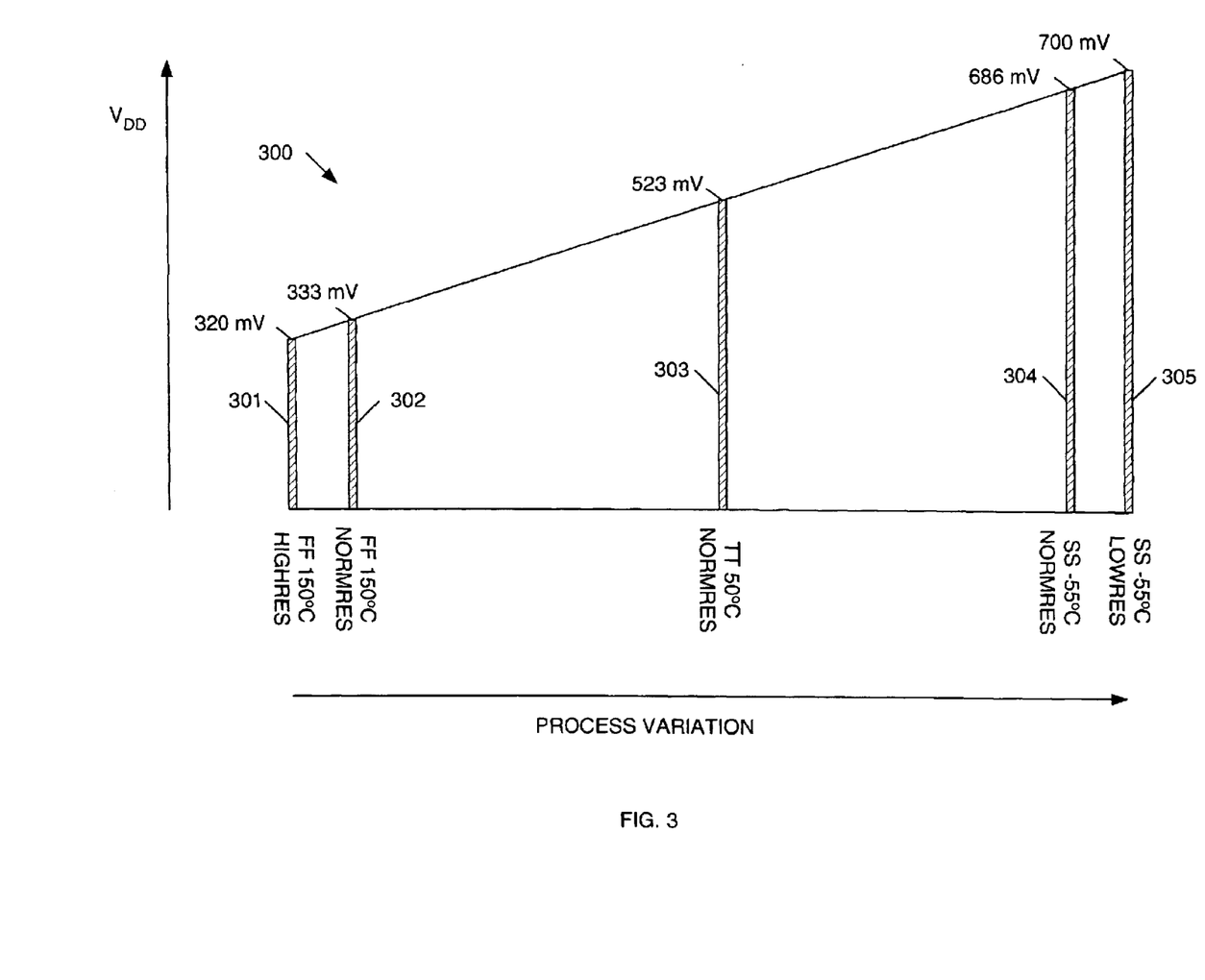
FIG. 3 is a bar graph illustrating the voltages at which the $V_{DD}$ supply voltage will activate an enable signal for various process corners of the $V_{DD}$ power-up detection circuit of FIG. 2.

FIG. 3 is a bar graph 300 illustrating the voltages at which the $V_{DD}$ supply voltage will activate the enable signal $EN_{211}$ for various process corners of circuit 200. Thus, bar 301 of graph 300 represents a fast-fast (FF) process corner (using a 3-sigma variation model), wherein transistors 201 and 202 have a relatively low threshold voltages (high carrier mobility), and resistors 203 and 204 have relatively high resistances (HIGHRES). Bar 301 also represents a relatively high operating temperature of 150° C. (which results in relatively high resistances of resistors 203–204 and low threshold voltages for transistors 201 and 202). Under these conditions, transistors 201 and 202 will turn on relatively fast, when the $V_{DD}$ supply voltage reaches a value of about 320 mV.

Bar 302 represents a fast-fast process corner for transistors 201 and 202, but normal resistances (NORMRES) for resistors 203 and 204. Bar 302 also represents a relatively high operating temperature of 150° C. Under these conditions, the enable signal $EN_{221}$ is activated when the $V_{DD}$ supply voltage reaches a value of about 333 mV.

Bar 303 represents a typical process corner (TT) for transistors 201 and 202, and normal resistances for resistors 203 and 204. Bar 302 also represents a moderate operating temperature of 50° C. Under these conditions, the enable signal $EN_{211}$ is activated when the $V_{DD}$ supply voltage reaches a value of about 523 mV.

Bar 304 represents a slow-slow (SS) process corner for transistors 201 and 202, wherein transistors 201 and 202 have relatively high threshold voltages (low carrier mobility) and resistors 203 and 204 have a typical resistance (NORMRES). Bar 304 also represents a relatively low operating temperature of −55° C. (which results in relatively low resistances of resistors 203–204 and high threshold voltages of transistors 201–202). Under these conditions, the enable signal $EN_{211}$ is activated when the $V_{DD}$ supply voltage reaches a value of about 686 mV.

Bar 305 represents a slow-slow process corner for transistors 201 and 202, but low resistances (LOWRES) for resistors 203 and 204. Bar 305 also represents a relatively low operating temperature of −55° C. Under these conditions, the enable signal $EN_{211}$ is activated when the $V_{DD}$ supply voltage reaches a value of about 700 mV.

Thus, $V_{DD}$ power-up detection circuit 200 ensures that for all process corners, Schmidt trigger circuit 210 will activate the $EN_{211}$ signal as long as the $V_{DD}$ supply voltage reaches a voltage of 700 mV. Thus, circuit 200 ensures that a $V_{DD}$ supply voltage having a nominal voltage of 0.8 Volts will be properly detected. Moreover, the trip point variation of 320 mV (FF) to 700 mV (SS) is acceptable because it is reasonable to assume that circuits 200 and 211 will experience similar variations. In addition, $V_{DD}$ power-up detection circuit 200 ensures that circuit 211 is properly enabled for different process corners.

Figure 4:
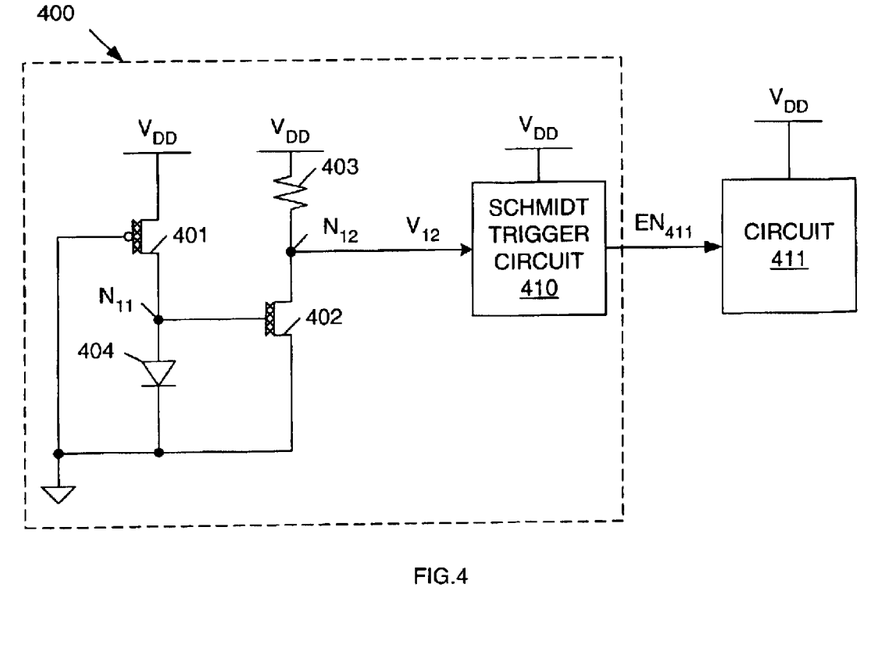
FIG. 4 is a circuit diagram of a $V_{DD}$ power-up detection circuit and an associated circuit in accordance with another embodiment of the present invention.

FIG. 4 is a circuit diagram of a $V_{DD}$ power-up detection circuit 400 and an associated circuit 411 in accordance with another embodiment of the present invention. $V_{DD}$ power-up detection circuit 400 includes thick oxide p-channel MOS transistor 401, thick oxide n-channel MOS transistor 402, resistors 403, diode element 404 and Schmidt trigger circuit 410. P-channel transistor 401 and diode element 404 are connected in series between the $V_{DD}$ voltage supply terminal and the ground voltage supply terminal. More specifically, p-channel transistor 401 is coupled between the $V_{DD}$ voltage supply terminal and node $N_{11}$, and diode element 404 is coupled between node $N_{11}$ and the ground voltage supply terminal. The gate of p-channel transistor 401 is coupled to the ground voltage supply terminal.

Resistor 403 and n-channel transistor 402 are also connected in series between the $V_{DD}$ voltage supply terminal and the ground voltage supply terminal. More specifically, resistor 403 is coupled between the $V_{DD}$ voltage supply terminal and node $N_{12}$, and n-channel transistor 402 is coupled between node $N_{12}$ and the ground voltage supply terminal. The gate of n-channel transistor 402 is coupled to node $N_{11}$. Node $N_{12}$ is coupled to provide a voltage $V_{12}$ to Schmidt trigger circuit 410.

In the described embodiment, transistors 401–402 are thick oxide transistors that provide the operating margin described above in connection with $V_{DD}$ power-up detection circuit 200 (FIG. 2). However, these transistors 401–402 can be core transistors in other embodiments if this operating margin is not desired. In the described embodiment, the channel region of p-channel transistor 401 has a width of about 54.5 microns and a length of about 0.4 microns. P-channel transistor 401 exhibits a threshold voltage of about 410 mV. The channel region of n-channel transistor 402 has a width of about 50 microns and a length of about 0.4 microns. N-channel transistor 402 exhibits a threshold voltage of about 430 mv.

Figure 5:
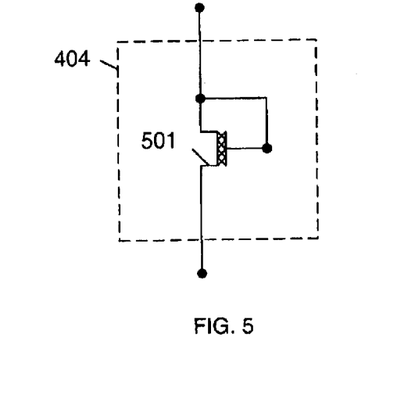
FIG. 5 is a circuit diagram illustrating an n-channel transistor, which is configured to implement a diode element in the $V_{DD}$ power-up detection circuit of FIG. 4, in accordance with one embodiment of the present invention.

In the described embodiment, resistor 403 is an unsalicided, p+ type polysilicon resistor having a resistance of about 26.9 kOhms. Other types of resistors can be used in other embodiments. In one embodiment, diode element 404 is a diode-connected n-channel transistor, although this is not necessary. FIG. 5 is a circuit diagram illustrating a thick oxide n-channel transistor 501, which is configured to implement diode element 404 in accordance with one embodiment of the invention.

$V_{DD}$ power-up detection circuit 400 operates in a manner similar to $V_{DD}$ power-up detection circuit 200 (FIG. 2), with diode element 404 taking the place of resistor 204. Thus, p-channel transistor 401 is initially turned off. The conductance of diode element 404 is designed to be greater than the subthreshold conductance of p-channel transistor 401. The voltage on node $N_{11}$ is therefore initially pulled down toward the ground supply voltage through diode 404.

Similarly, n-channel transistor 402 is initially turned off. The conductance of resistor 403 is designed to be greater than the subthreshold conductance of n-channel transistor 402. The voltage on node $N_{12}$ is therefore initially pulled up toward the $V_{DD}$ supply voltage through resistor 403.

When the $V_{DD}$ supply voltage reaches or exceeds the threshold voltage of p-channel transistor 401, this transistor 401 begins to turn on, thereby causing the conductance of p-channel transistor 401 to increase. P-channel transistor 401 is designed such that the on-conductance of this transistor 401 becomes significantly greater than the forward conductance of diode element 404 when the $V_{DD}$ supply voltage reaches a predetermined voltage greater than the threshold voltage of p-channel transistor 401 but less than the full $V_{DD}$ supply voltage.

When the on-conductance of p-channel transistor 401 becomes significantly greater than the forward conductance of diode element 404, the voltage on node $N_{11}$ will be pulled up to a value close to the $V_{DD}$ supply voltage.

When the voltage on node $N_{11}$ reaches or exceeds the threshold voltage of n-channel transistor 402, this transistor 402 begins to turn on, thereby causing the conductance of n-channel transistor 402 to increase. As a result, the voltage on node $N_{12}$ is pulled down toward the ground supply voltage. N-channel transistor 402 is designed such that the on-conductance of this transistor 402 becomes significantly greater than the conductance of resistor 403 when the voltage on node $N_{11}$ reaches a predetermined voltage greater than the threshold voltage of n-channel transistor 402 but less than the full $V_{DD}$ supply voltage.

When the on-conductance of n-channel transistor 402 becomes significantly greater than the conductance of resistor 403, the voltage on node $N_{12}$ will be pulled down to a value close to the ground supply voltage.

Schmidt trigger circuit 410 operates in the same manner as Schmidt trigger circuit 200 (FIG. 2). Thus, Schmidt trigger circuit 410 activates the enable signal $EN_{411}$ (and thereby circuit 411), when the voltage $V_{12}$ is pulled down a predetermined percentage below the $V_{DD}$ supply voltage. In the present embodiment, it is estimated that the enable signal $EN_{411}$ will be activated when the $V_{DD}$ supply voltage reaches about 535 mV, and the voltage $V_{12}$ is pulled down to a voltage of about 129 mV.

$V_{DD}$ power-up detection circuit 400 exhibits advantages similar to $V_{DD}$ power-up detection circuit 200.

Figure 6:
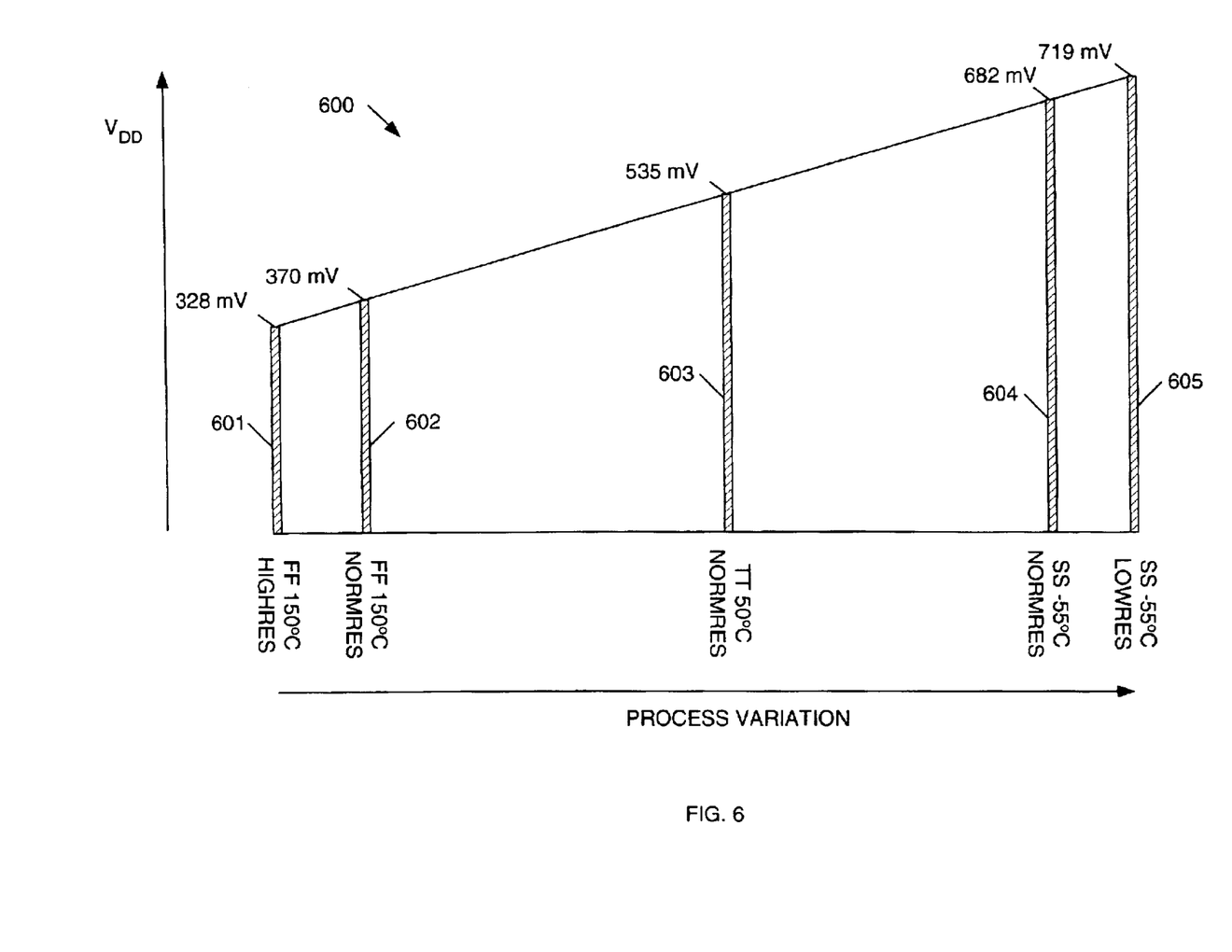
FIG. 6 is a bar graph illustrating the voltages at which the $V_{DD}$ supply voltage will activate an enable signal for various process corners and conditions of the $V_{DD}$ power-up detection circuit of FIG. 4.

FIG. 6 is a bar graph 600 illustrating the voltages at which the $V_{DD}$ supply voltage will activate the $EN_{411}$ signal for various process corners and conditions of circuit 400. The conditions associated with bars 600–605 of graph 600 are the same as the above-described conditions of bars 300–305, respectively, of graph 300. Thus, bars 601, 602, 603, 604, and 605 specify that the enable signal $EN_{411}$ will be activated when the $V_{DD}$ supply voltage reaches values of about 328 mV, 370 mV, 535 mV, 682 mV, and 719 mV, respectively. Thus, the performance of $V_{DD}$ power-up detection circuit 400 is similar to the performance of $V_{DD}$ power-up detection circuit 200.

Although the invention has been described in connection with several embodiments, it is understood that this invention is not limited to the embodiments disclosed, but is capable of various modifications, which would be apparent to one of ordinary skill in the art. Thus, the $V_{DD}$ power-up detection circuit of the present invention can be used in a variety of integrated circuit devices, including, but not limited to, field programmable gate arrays. Thus, the invention is limited only by the following claims.

I claim:

1. A voltage detection circuit comprising:
    a $V_{DD}$ voltage supply terminal for receiving a $V_{DD}$ supply voltage during power-up;
    a ground supply terminal for receiving a ground supply voltage;
    a p-channel transistor having a source coupled to the $V_{DD}$ voltage supply terminal and a gate coupled to the ground supply terminal;
    a first resistor coupled between a drain of the p-channel transistor and the ground supply terminal;
    an n-channel transistor having a source coupled to the ground supply terminal and a gate coupled to the drain of the p-channel transistor; and
    a second resistor coupled between a drain of the n-channel transistor and the $V_{DD}$ voltage supply terminal.

2. The voltage detection circuit of claim 1, further comprising a trigger circuit coupled to the drain of the n-channel transistor.

3. The voltage detection circuit of claim 1, wherein the $V_{DD}$ supply voltage has a nominal voltage of about 1.2 Volts or less.

4. The voltage detection circuit of claim 1, wherein the first resistor and the second resistor are the same size.

5. The voltage detection circuit of claim 1, wherein the first resistor and the second resistor comprise unsalicided P+ type polysilicon.

6. The voltage detection circuit of claim 1, wherein the p-channel transistor has a subthreshold conductance that is less than a conductance of the first resistor.

7. The voltage detection circuit of claim 6, wherein the p-channel transistor has an on-conductance that is greater than the conductance of the first resistor when a gate-to-source voltage of the p-channel transistor is greater than a predetermined voltage, which is greater than a threshold voltage of the p-channel transistor.

8. The voltage detection circuit of claim 7, wherein the n-channel transistor has a subthreshold conductance that is less than a conductance of the second resistor.

9. The voltage detection circuit of claim 8, wherein the n-channel transistor has an on-conductance that is greater than the conductance of the second resistor when a gate-to-source voltage of the n-channel transistor is greater than a second predetermined voltage, which is greater than a threshold voltage of the n-channel transistor.

10. The voltage detection circuit of claim 1, wherein the n-channel transistor has a subthreshold conductance that is less than a conductance of the second resistor.

11. The voltage detection circuit of claim 10, wherein the n-channel transistor has an on-conductance that is greater than the conductance of the second resistor when a gate-to-source voltage of the n-channel transistor is greater than a predetermined voltage, which is greater than a threshold voltage of the n-channel transistor.

12. A method of detecting when a $V_{DD}$ supply voltage has reached a level adequate to operate a circuit, the method comprising:

pulling down a voltage on a gate of an n-channel transistor through a first resistor when the $V_{DD}$ supply voltage is less than a threshold voltage of a p-channel transistor, wherein a subthreshold conductance of the p-channel transistor is less than a conductance of the first resistor;

pulling up the voltage on the gate of the n-channel transistor through the p-channel transistor when the $V_{DD}$ supply voltage is greater than the threshold voltage of the p-channel transistor, wherein an on-conductance of the p-channel transistor becomes greater than the conductance of the first resistor when the $V_{DD}$ supply voltage reaches a first predetermined voltage greater than the threshold voltage of the p-channel transistor;

pulling up a voltage on a drain of the n-channel transistor through a second resistor when the voltage on the gate of the n-channel transistor is less than a threshold voltage of the n-channel transistor, wherein a subthreshold conductance of the n-channel transistor is less than a conductance of the second resistor; and pulling down the voltage on the drain of the n-channel transistor through the n-channel transistor when the voltage on the gate of the n-channel transistor is greater than the threshold voltage of the n-channel transistor, wherein an on-conductance of the n-channel transistor becomes greater than the conductance of the second resistor when a gate-to-source voltage of the n-channel transistor reaches a second predetermined voltage greater than the threshold voltage of the n-channel transistor.

13. The method of claim 12, further comprising comparing the voltage on the drain of the n-channel transistor with the $V_{DD}$ supply voltage.

14. The method of claim 12, further comprising enabling an associated circuit when the voltage on the drain of the n-channel transistor has a predetermined relationship with respect to the $V_{DD}$ supply voltage.

15. A voltage detection circuit comprising:
a $V_{DD}$ voltage supply terminal for receiving a $V_{DD}$ supply voltage during power-up;
a ground supply terminal for receiving a ground supply voltage;
a p-channel transistor having a source coupled to the $V_{DD}$ voltage supply terminal and a gate coupled to the ground supply terminal;
a diode element coupled between a drain of the p-channel transistor and the ground supply terminal;
an n-channel transistor having a source coupled to the ground supply terminal and a gate coupled to the drain of the p-channel transistor; and
a resistor coupled between a drain of the n-channel transistor and the $V_{DD}$ voltage supply terminal.

16. The voltage detection circuit of claim 15, further comprising a trigger circuit coupled to the drain of the n-channel transistor.

17. The voltage detection circuit of claim 15, wherein the $V_{DD}$ supply voltage has a nominal voltage of about 1.2 Volts or less.

18. The voltage detection circuit of claim 15, wherein the diode element comprises an n-channel transistor having a drain and a gate commonly coupled to the drain of the p-channel transistor, and a source coupled to the ground voltage supply terminal.

19. The voltage detection circuit of claim 15, wherein resistor comprises unsalicided P+ polysilicon.

20. The voltage detection circuit of claim 15, wherein the p-channel transistor has a subthreshold conductance that is less than a conductance of the diode element.

21. The voltage detection circuit of claim 20, wherein the p-channel transistor has an on-conductance that is greater than the conductance of the diode element when a gate-to-source voltage of the p-channel transistor is greater than a predetermined voltage, which is greater than a threshold voltage of the p-channel transistor.

22. The voltage detection circuit of claim 21, wherein the n-channel transistor has a subthreshold conductance that is less than a conductance of the resistor.

23. The voltage detection circuit of claim 22, wherein the n-channel transistor has an on-conductance that is greater than the conductance of the resistor when a gate-to-source voltage of the n-channel transistor is greater than a second predetermined voltage, which is greater than a threshold voltage of the n-channel transistor.

24. The voltage detection circuit of claim 15, wherein the n-channel transistor has a subthreshold conductance that is less than a conductance of the resistor.

25. The voltage detection circuit of claim 24, wherein the n-channel transistor has an on-conductance that is greater than the conductance of the resistor when a gate-to-source voltage of the n-channel transistor is greater than a predetermined voltage, which is greater than a threshold voltage of the n-channel transistor.

26. A method of detecting when a $V_{DD}$ supply voltage has reached a level adequate to operate a circuit, the method comprising:
pulling down a voltage on a gate of an n-channel transistor through a diode element when the $V_{DD}$ supply voltage is less than a threshold voltage of a p-channel transistor, wherein a subthreshold conductance of the p-channel transistor is less than a conductance of the diode element;

pulling up the voltage on the gate of the n-channel transistor through the p-channel transistor when the $V_{DD}$ supply voltage is greater than the threshold voltage of the p-channel transistor, wherein an on-conductance of the p-channel transistor becomes greater than the conductance of the diode element when the $V_{DD}$ supply voltage reaches a first predetermined voltage greater than the threshold voltage of the p-channel transistor;

pulling up a voltage on a drain of the n-channel transistor through a resistor when the voltage on the gate of the n-channel transistor is less than a threshold voltage of the n-channel transistor, wherein a subthreshold conductance of the n-channel transistor is less than a conductance of the resistor; and pulling down the voltage on the drain of the n-channel transistor through the n-channel transistor when the voltage on the gate of the n-channel transistor is greater than the threshold voltage of the n-channel transistor, wherein an on-conductance of the n-channel transistor becomes greater than the conductance of the resistor when a gate-to-source voltage of the n-channel transistor reaches a second predetermined voltage greater than the threshold voltage of the n-channel transistor.

27. The method of claim 26, further comprising comparing the voltage on the drain of the n-channel transistor with the $V_{DD}$ supply voltage.

28. The method of claim 26, further comprising enabling an associated circuit when the voltage on the drain of the n-channel transistor has a predetermined relationship with respect to the $V_{DD}$ supply voltage.

* * * * *